(12) United States Patent
Serrer et al.

(10) Patent No.: US 9,977,081 B2
(45) Date of Patent: May 22, 2018

(54) SCAN SPEED OPTIMIZATION OF INPUT AND OUTPUT PATHS

(71) Applicants: Jurgen Serrer, Holzgerlingen (DE); Martin Fischer, Heilbronn (DE)

(72) Inventors: Jurgen Serrer, Holzgerlingen (DE); Martin Fischer, Heilbronn (DE)

(73) Assignee: ADVANTEST CORPORATION, Tokyo (JP)

( * ) Notice: Subject to any disclaimer, the term of this patent is extended or adjusted under 35 U.S.C. 154(b) by 54 days.

(21) Appl. No.: 14/881,129

(22) Filed: Oct. 12, 2015

(65) Prior Publication Data

US 2016/0033574 A1 Feb. 4, 2016

Related U.S. Application Data

(63) Continuation of application No. PCT/EP2013/057713, filed on Apr. 12, 2013.

(51) Int. Cl.
| | |
|---|---|
| *G01R 31/30* | (2006.01) |
| *G01R 31/317* | (2006.01) |
| *G01R 31/3177* | (2006.01) |
| *G01R 31/3185* | (2006.01) |
| *G01R 31/319* | (2006.01) |
| *G01R 31/3193* | (2006.01) |

(52) U.S. Cl.
CPC ..... *G01R 31/3177* (2013.01); *G01R 31/3016* (2013.01); *G01R 31/31725* (2013.01); *G01R 31/31922* (2013.01); *G01R 31/318594* (2013.01); *G01R 31/31937* (2013.01)

(58) Field of Classification Search
CPC .......... G01R 31/3177; G01R 31/31725; G01R 31/318594; G01R 31/31922; G01R 31/3016; G01R 31/3191; G01R 31/31937
USPC ....................................................... 714/700
See application file for complete search history.

(56) References Cited

U.S. PATENT DOCUMENTS

| | | | |
|---|---|---|---|
| 6,282,592 B1 | 8/2001 | Aston et al. | |
| 7,334,148 B2 * | 2/2008 | Liu ........................... | G06F 1/10 713/400 |
| 8,185,791 B2 * | 5/2012 | Bull .......................... | G06F 1/10 714/745 |
| 8,191,033 B1 * | 5/2012 | Bruch .............. | G01R 31/31709 326/101 |
| 8,373,433 B2 * | 2/2013 | Washizu .......... | G01R 31/31922 324/537 |
| 2010/0207640 A1 | 8/2010 | Washizu | |
| 2012/0062266 A1 | 3/2012 | Gorti et al. | |

* cited by examiner

*Primary Examiner* — James C Kerveros

(57) ABSTRACT

Disclosed herein is a scan optimizer system and method designed to generate optimal ATE input/output timing with small margin but yielding stable results. Therefore the scan test time is greatly improved.

10 Claims, 8 Drawing Sheets

SCAN SPEED OPTIMIZATION OF INPUT AND OUTPUT PATHS

CROSS-REFERENCE TO RELATED APPLICATIONS

This application is a continuation of copending International Application No. PCT/EP2013/057713, filed Apr. 12, 2013, which is incorporated herein by reference in its entirety.

This invention relates to integrated circuit testing, and in particular to optimization of test times and scan shift frequencies.

BACKGROUND OF THE INVENTION

Scan chain is a technique used in Design For Test. The objective is to make testing easier by providing a simple way to set and observe every flip-flop in an IC. A special signal called scan enable is added to a design. When this signal is asserted, every flip-flop in the design is connected into one or more long shift registers, one input pin provides the data to each chain, and one output pin is connected to the output of each chain. Then using the chip's clock signal, an arbitrary pattern can be entered into each chain of flip flops, and/or the state of every flip flop can be read out. Test patterns are shifted in via the scan chain(s), functional clock signals are pulsed to test the circuit during the "launch/capture cycle(s)", and the results observed are then shifted out to chip output pins and compared against the expected "good machine" results.

In scan chain testing, optimization, i.e., maximizing shift frequency, thus minimizing test times, is desired. The scan chain shift frequency is limited by:

a) The inherent timing of the scan chain, determined by the set-up and hold times of the scan flip flops, and
b) The input path to the first flip flop and output path from the last flip flop. The frequency response of these paths is dependent on such factors as Vdd, temperature, power grid, and process details; and
c) I/O timing.

The ATE input/output timing in current technology generally is a significant limitation on the scan test speeds. Increasing the scan speed beyond a safe timing margin can cause instability in scan test results. Therefore, the usual practice is to reduce the test speed so as to build in large timing margins, giving stable results, but increasing the test time.

SUMMARY

According to an embodiment, a scan optimizer system may have:
  multiple parallel scan chains; and
  a provider for providing an optimal combination of timing of said multiple parallel scan chains and scan frequency of said multiple parallel scan chains to maximize throughput;
    wherein said multiple parallel scan chains include an input path and an output path;
    wherein said provider for providing an optimal combination of timing of said multiple parallel scan chains and scan frequency of said multiple parallel scan chains to maximize throughput includes a modifier for modifying timing of said input path and said output path; and
    wherein said provider for providing an optimal combination of timing of said multiple parallel scan chains and scan frequency of said multiple parallel scan chains to maximize throughput is configured to increase an optimal scan frequency by modifying the timing offsets of each individual scan chain to reduce the timing skew between the multiple parallel scan chains, to enable TDO strobe to occur at viable times for all multiple parallel scan chains, and to optimize the data edge positions for the input path.

Another embodiment may have a computer-implemented method of maximizing scan throughput of multiple parallel scan chains by determining an optimal combination of shift frequency and time delay;
  wherein determining an optimal combination of shift frequency and time delay may have the steps of:
    controlling TDI input data edge during shift in to position the input data edge near center of a passing range of said scan chain;
    controlling and adjusting TDO strobe edge during shift out to position the TDO strobe edge near center of a passing range of said multiple scan chains; and
    increasing an optimal scan frequency by modifying the timing offsets of each individual scan chain to reduce the timing skew between the multiple parallel scan chains, to enable TDO strobe to occur at viable times for all multiple parallel scan chains, and to optimize the data edge positions for the input path.

According to another embodiment, a computer-implemented method of maximizing scan throughput of multiple parallel scan chains by determining an optimal combination of shift frequency and time delay may have the steps of:
  a) choosing a safe shift frequency;
  b) determining optimal scan pin timing at said safe frequency;
    wherein determining optimal scan pin timing at said safe frequency includes modifying the timing offsets of each individual scan chain to reduce the timing skew between the multiple parallel scan chains, to enable TDO strobe to occur at viable times for all multiple parallel scan chains, and to optimize the data edge positions for the input path;
  c) determining and applying optimized per-pin timing settings for TDI, TDO, and Mode control pins;
  d) determining a maximum shift frequency associated with said optimized per-pin timing settings; and
  e) repeating steps a-d as often as desired using the maximum shift frequency of step d) as a new safe shift frequency.

According to another embodiment, an automated test equipment may have:
  one or more output channels for providing one or more tester output signals to one or more inputs of multiple parallel scan chains of a device under test;
  one or more input channels for receiving one or more device under test output signals from multiple parallel scan chains of a device under test; and
  a controller,
  wherein the controller is configured to determine, at a first clock rate of a scan chain clock of the multiple parallel scan chains, a timing of transitions of the one or more device under test output signals, and to adjust a sample timing of the one or more input channels in dependence on the determination of the timing of transitions of the one or more device under test output signals, to place adjusted strobe points of the one or more input channels at centers of respective stable regions of the device under test output signals within a tolerance of +/−20 percent;
  wherein the controller is configured to determine, at the first clock rate of the scan chain clock of the multiple scan chains, timing requirements of one or more device under test input signals provided by the one or more output channels to the inputs of the multiple parallel scan chains of the device under test, and to adjust a transition timing of the one or more output channels in dependence on the determination of the timing requirements of the one or more device under test input signals, to place adjusted edge points of the one or more output channels at centers of respective stable regions of the device under test input signals within a tolerance of +/−20 percent;

wherein the controller is configured to increase a clock rate of the scan chain clock to be higher than the first clock rate, to identify a maximum clock rate of the scan chain clock which allows for a reliable data handover between the test equipment and the multiple parallel scan chains using the adjusted sample timing of the one or more input channels and the adjusted transition timing of the one or more output channels; and wherein the controller is configured to increase an optimal scan frequency by modifying the timing offsets of each individual scan chain to reduce the timing skew between the multiple parallel scan chains, to enable TDO strobe to occur at viable times for all multiple parallel scan chains, and to optimize the data edge positions for the input path.

Disclosed herein is a scan optimizer system and method designed to generate optimal ATE input/output timing with small margin but yielding stable results. Therefore the scan test time is greatly improved.

BRIEF DESCRIPTION OF THE DRAWINGS

Embodiments of the present invention will be detailed subsequently referring to the appended drawings, in which.

DETAILED DESCRIPTION OF THE INVENTION

The system and method disclosed herein addresses optimization of input/output timing for multiple parallel scan chains (although aspects of the invention can be applied to single scan chain design). Note that maximizing frequency takes all of the above-listed factors into account in addition to I/O timing. The input (TDI) and output (TDO) timing is optimized on a per-pin basis. The output timing is adjusted according to the output strobe timing, whereas the input timing is optimized according to the input data edge, which is dependent on the set-up and hold times of the first flip-flop in the chain, as well as path delays. Also note that the maximum attainable frequency is not necessarily the optimum frequency. In practice the optimal operating frequency may be backed off somewhat from the maximum.

Figure 1:
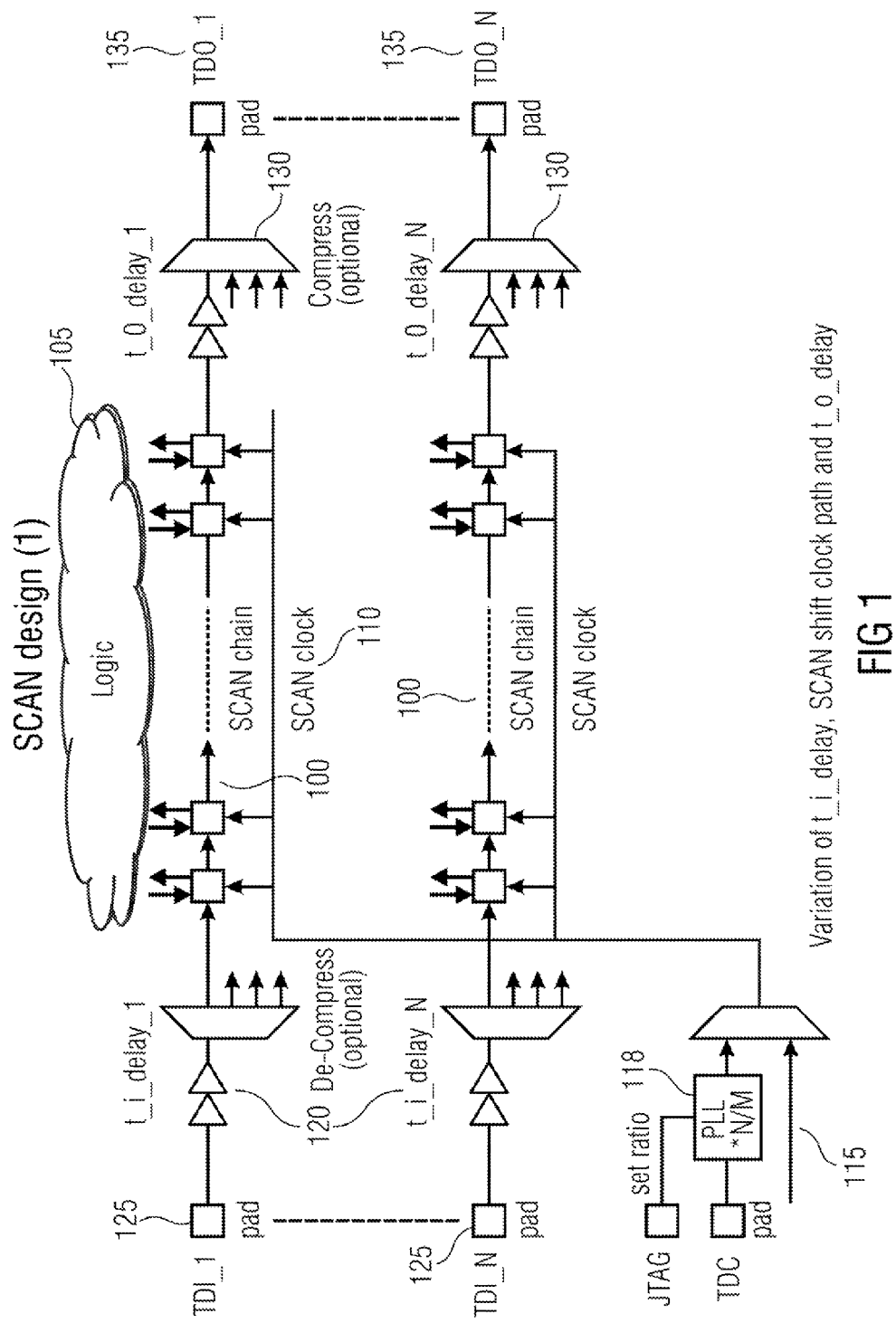
FIG. 1 illustrates the components of an exemplary scan chain system design which involves timing optimization.

FIG. 1 illustrates the components of an exemplary scan chain system design which involves timing optimization. Scan chains 1-N (100) are each coupled to logic 105 and controlled by SCAN clocks 110. Control logic 115 controls scan circuitry. Included in the control logic is Phase Lock Loop 118 which may control scan clock frequency (i.e. for "launch/capture"). Input path delays 120 occur between input pads 125 and scan chains 100. Other non-clocked delays 130 occur between scan chains 100 and output pads 135. These non-clocked delays include path delays for TDI and TDO, and well as variations for distributed clock 110 across the device under test.

Figure 2:
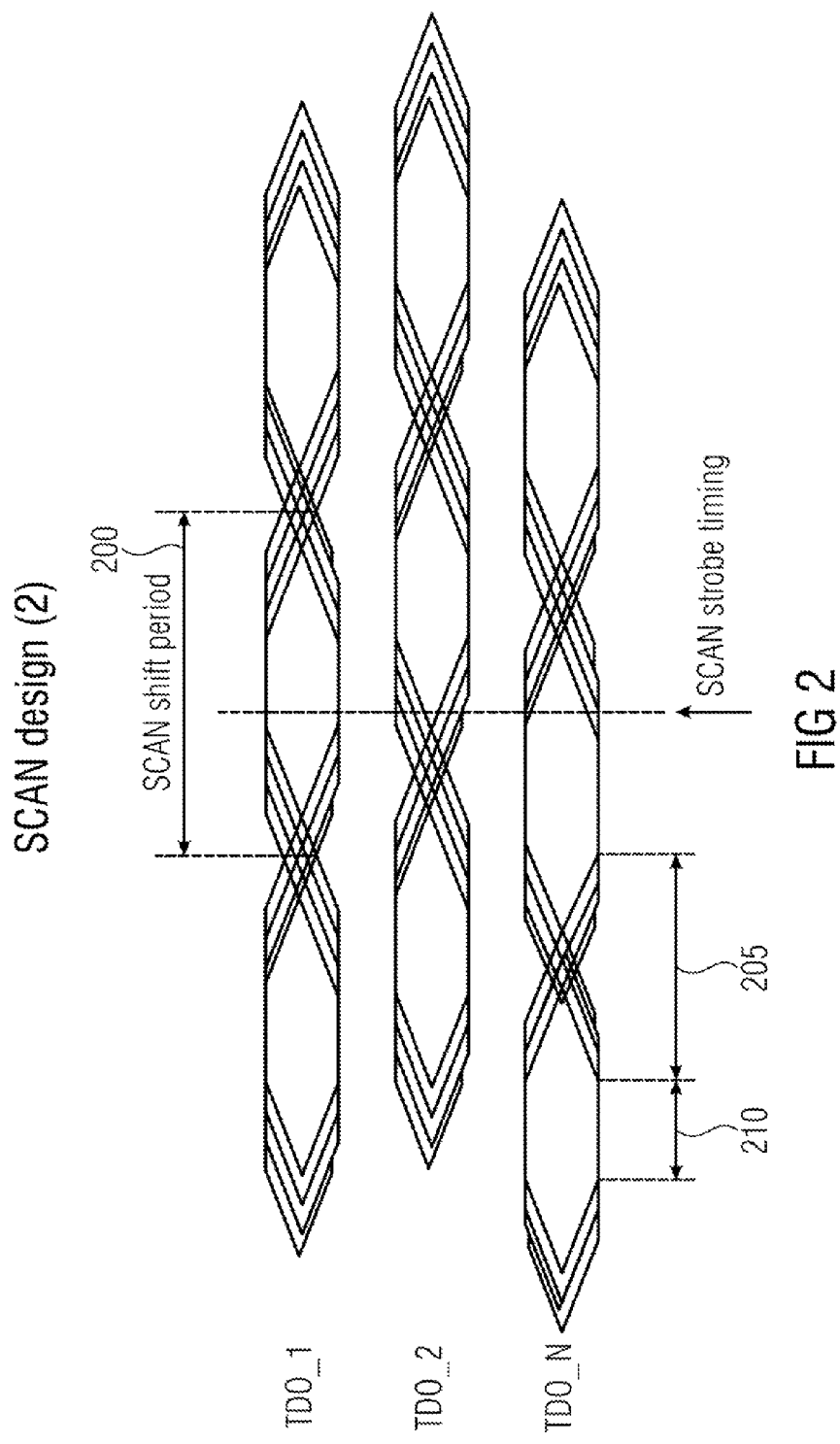
FIG. 2 illustrates SCAN strobe timing on the TDO pins for several scan chains being tested in parallel.

FIG. 2 illustrates SCAN strobe timing on the TDO pins for several scan chains being tested in parallel. Periods 200 are the scan shift periods. During time period 205 the data values are changing, and during time period 210 of scan shift periods 200, the data values are stable. In order to efficiently and effectively use scan chains for testing the logic, individually or in parallel, the scan data capture is performed at the same time (relative to a beginning of a scan shift period) during each scan shift period, according to the scan strobe, wherein, according to embodiments of the invention, the scan data capture may be performed at different times for different channels. Because of the variability in timing for each scan chain (called "timing skew", which, for multiple scan chains being used in parallel results in timing offsets between the various scan chains, the scan strobe intersects the scan shift period at a different location for each scan chain. For parallel testing using multiple scan chains, if the timing skews are too large relative to the scan shift period, there may be no "sampling eye" where all scan chains can be simultaneously sampled, i.e, where the data values are stable for all the scan chains. Sampling may also be compromised even for an individual scan chain test if the strobe is not properly positioned in the shift period. Present methods avoid this problem by decreasing the scan shift frequency to a "safe" frequency wherein the sampling eye is long enough to insure that timing skews are within the acceptable range. However, this results in lower scan frequencies and increases scan test times.

The inventors have recognized that the optimal shift frequency may be increased by modifying the timing offsets of each individual scan chain to reduce the timing skew between the multiple scan chains, to enable the TDO strobe to occur at viable times for all scan chains, and to optimize the data edge positions for the input path. If the strobe timing approaches the center of the passing range for all scan chains in the clock domain, the scan shift frequency can be increased without sending the strobe into non-viable regions. Correspondingly, it is optimal to position the input data edge near the center of the passing range. Note that the optimal shift frequency is not generally the maximum possible shift frequency: as will be described hereinafter, yield considerations may indicate a somewhat lower optimal frequency.

An embodiment of the present invention provides a method for optimizing scan pin timing so as to maximize the safe scan frequency. In general, this method includes maximizing scan throughput by determining the best, i.e. optimal, combination of shift frequency and time delay. In the case of multiple parallel scan chains, the shift frequency is constrained to be the same for all scan chains in a clock domain, although multiple clock domains are possible. Timing skew may be optimized for each individual scan chain or clock domain.

The optimization of the combination of frequency (f) and time delay ($\Delta t$) for each scan chain may be accomplished in various ways. These include but are not limited to: a) performing a linear search over both f and Δt; b) performing a 2D binary search over f and Δt; c) other search algorithms. Most searches include P/F validity checks (which may be implemented in hardware or software) at a particular combination of f and Δt. These validity checks may include the following steps:

1. generate test pattern;
2. load test pattern on all scan chains;
3. unload test pattern from all scan chains;
4. if load=unload, pass
   if load not=unload, fail
5. repeat n times to be sure a false positive was not obtained, i.e. a pass when should have failed.

In an embodiment, the optimization of timing skew is achieved with the use of timing verniers, which can be implemented in a variety of ways, included in the input (TDI and TDO) and output (TDO) paths, in addition to period generators used to vary the frequency.

Figure 3:
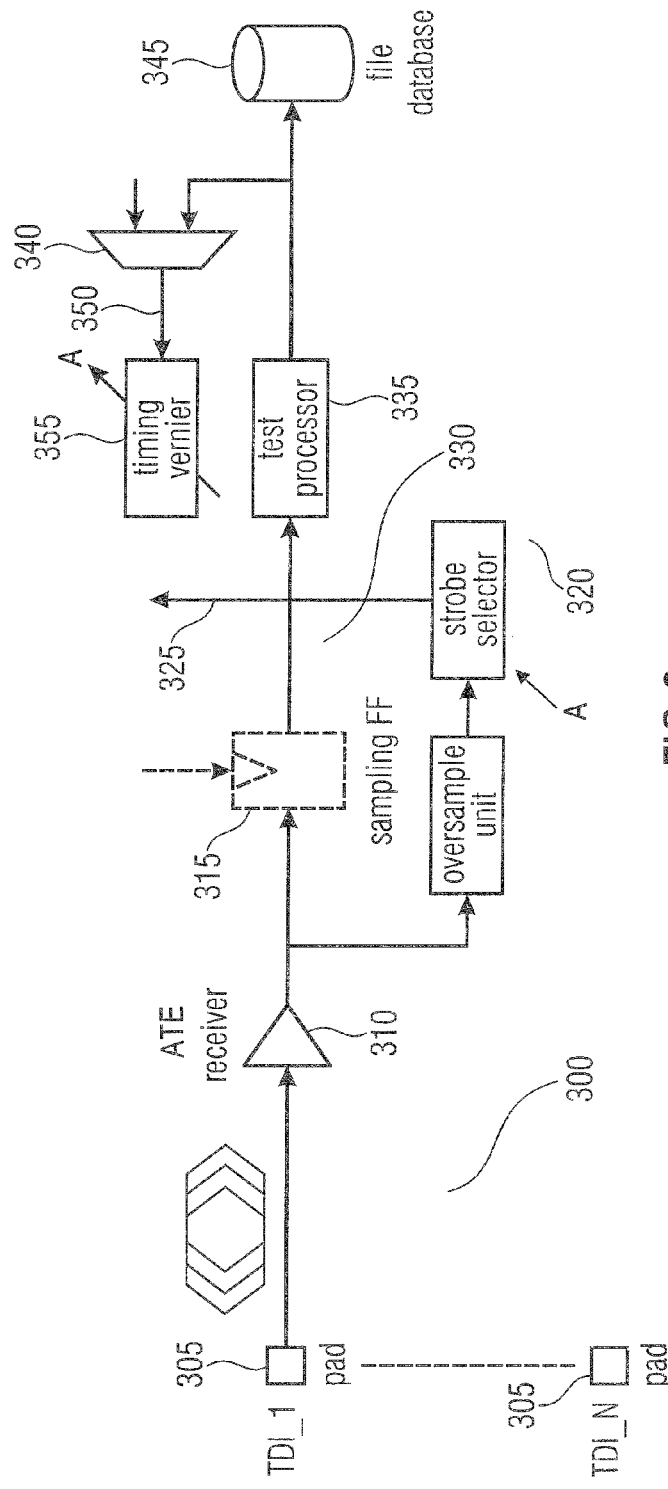
FIG. 3 illustrates an embodiment of output TDO path incorporating inventive scan speed optimization.

FIG. 3 illustrates an embodiment of output TDO path incorporating inventive timing adjustment means for scan speed optimization. This embodiment is exemplary but not limiting. The TDO pins are used for controlling data strobing during "shift out". Output path 300 from output pad 305 includes ATE receiver 310, which is connected to sampling flip-flop 315. The sampling is controlled by strobe 320, which has input 325 to sampling flip-flop 315. Output 330 from sampling flip flop 315 is fed into test processor 335, which may be a state machine, and where a pass/fail decision is made regarding the sampled data. Inputs to multiplexer 340 may include pass/fail results from processor 335, as well as data from file database 345. Output 350 forms a feedback loop to modify the strobe position in the scan shift period. Analog timing vernier 355 in the feedback loop may be adjusted to alter the timing of strobe 320. The inventive configuration enables controlling and adjusting the TDO strobe edge during "shift out".

Figure 4:
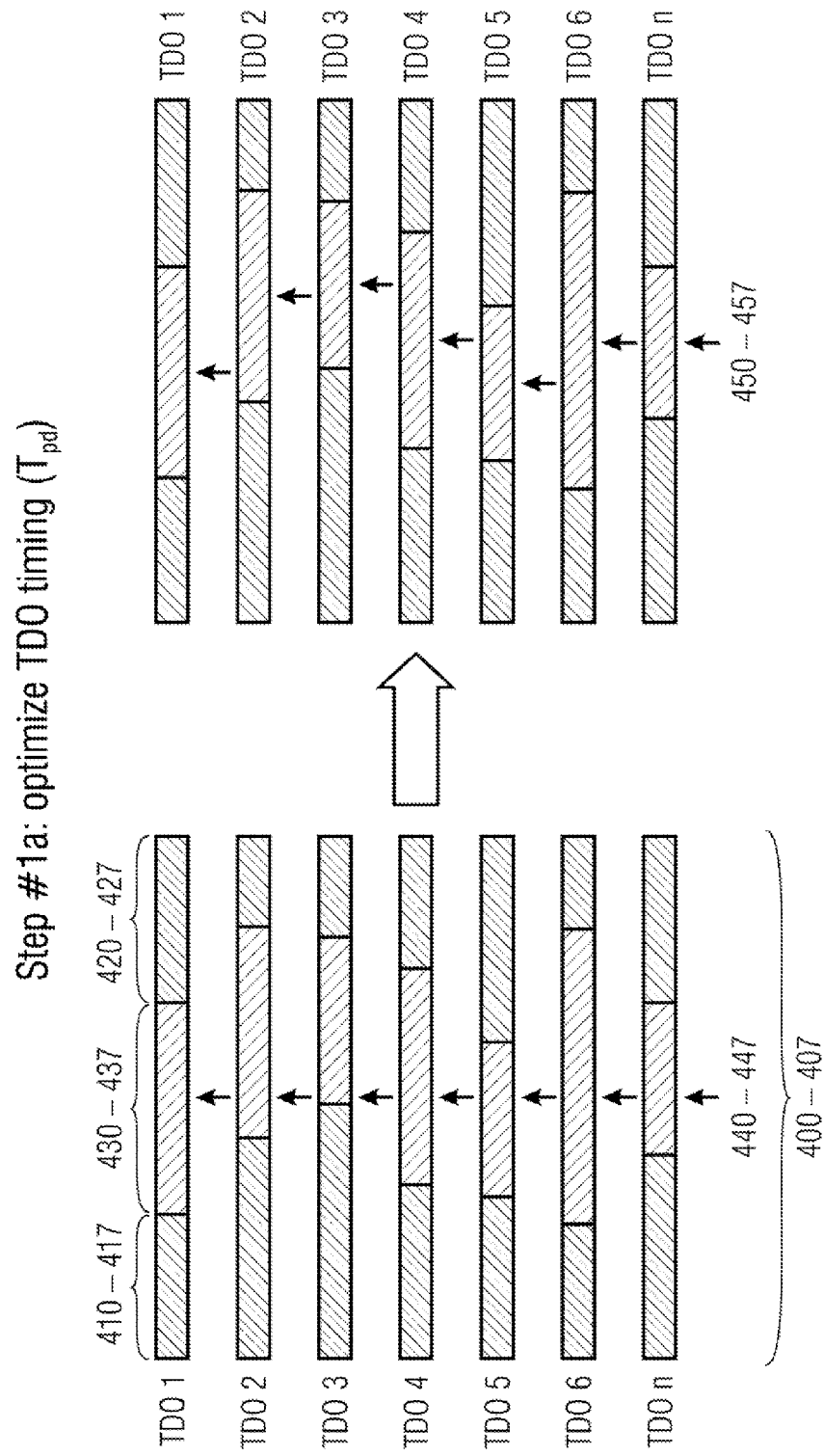
FIG. 4 shows the results of optimizing the timing of the output TDO path.

FIG. 4 pictorially shows the results of optimizing the timing of the output TDO path. Scan shift periods 400-407 are associated with output pins TDO1-TDOn. Timing regions 410-417 and 420-427 are unstable regions where data values are increasing or decreasing, and 430-437 are the stable regions (also termed "pass windows"). Note that, if the TDO strobe falls within an unstable region, the test result would be "fail", whereas if the TDO strobe falls within a stable region, the test result would be "pass" for a properly operating device under test (DUT). If no timing skew adjustments are made, strobe points 440-447 occur at the same time, which for some pins is very near the unstable regions, and allows only a very small acceptable window (or no acceptable window if timing skews were slightly greater than those shown in this example). If timing skew adjustments are made, as according to the instant inventive method and apparatus, TDO strobe points 450-457 are substantially centered in the middle of pass windows 430-437. The acceptable window is thereby increased, and yield improved.

Figure 5:
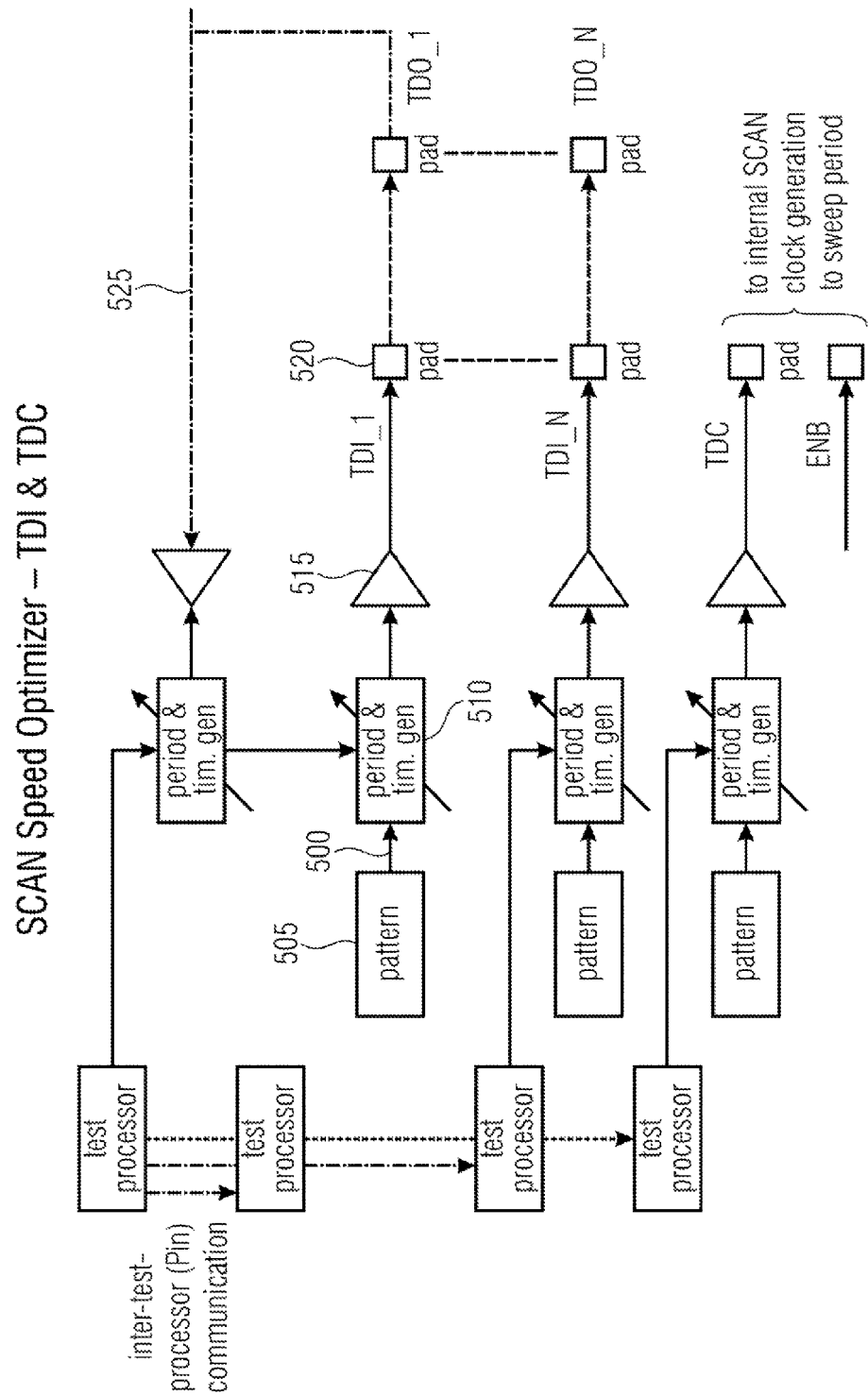
FIG. 5 illustrates an embodiment of input TDI and clock path TDO incorporating inventive scan speed optimization.

FIG. 5 illustrates an embodiment of input pins TDI and clock path pin TDO incorporating inventive scan speed optimization. Pattern output 500 from pattern generator 505 is input into analog timing vernier 510 which may be used to adjust the input pattern timing into driver 515 and subsequently into input pad 520 which controls shift in data. Also input into timing vernier 510 is data from feedback loop 525. Use of the analog timing vernier enables controlling the TDI input data edges during "shift in".

Figure 6:
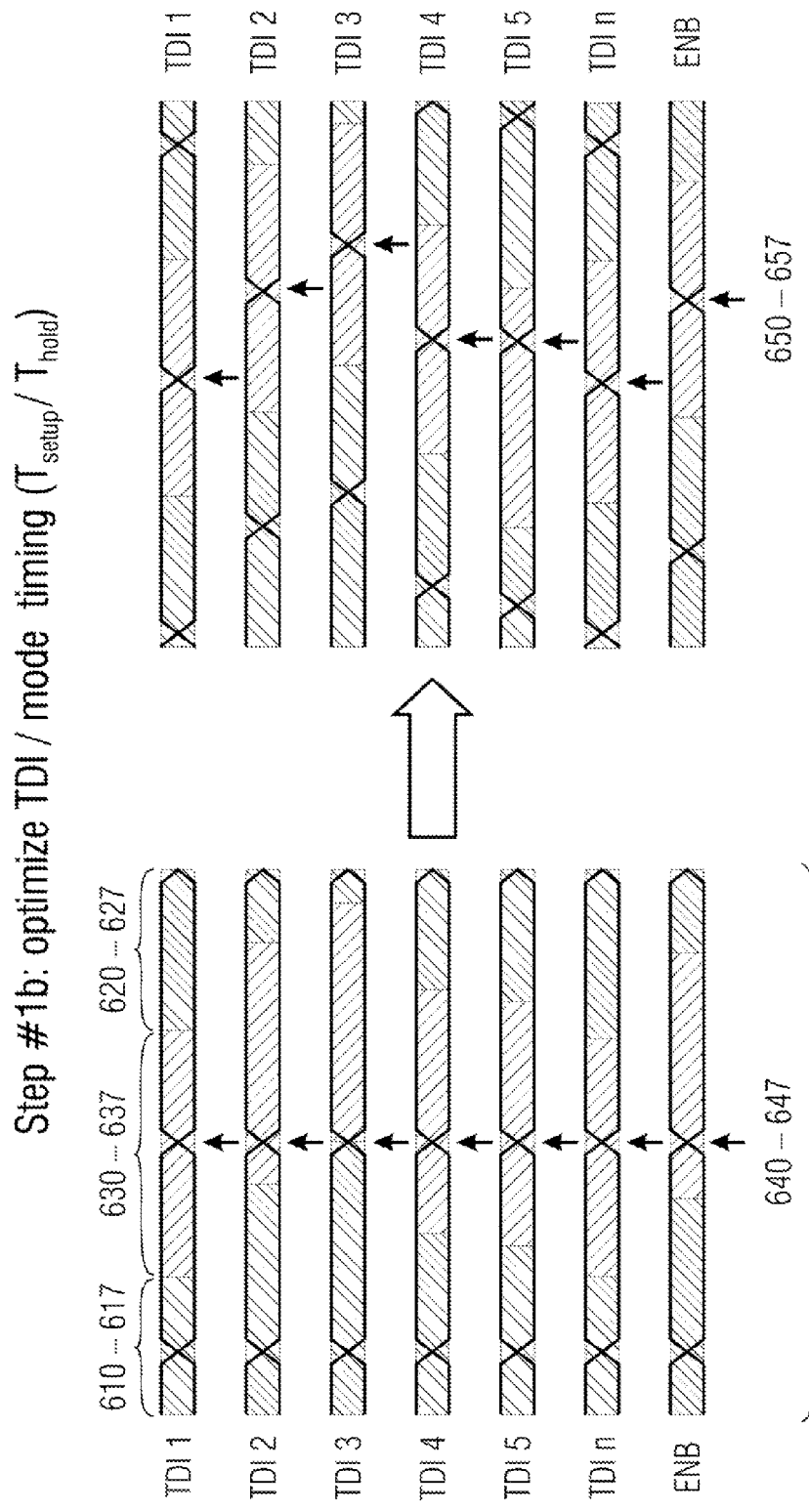
FIG. 6 pictorially shows the results of optimizing the timing of the input TDI/Mode path.

FIG. 6 pictorially shows the results of optimizing the timing of the input TDI/Mode path. Note that the input timing is dependent on the scan flip flop setup/hold times. The crossing point of the lines (also marked by the arrows) shows where input data provided by the ATE for TDIs (125 in FIG. 1), i.e. for one or more TDI inputs of the device under test, is changed. The scan period is the distance between the crossing points of the lines. The light grey area illustrates the "safe operating" area in which data can be changed at TDI (or ENB) for properly passing data to the scan chain (100 in FIG. 1). In other words, the light grey areas 630 to 637 describe temporal regions during which the data output by the tester to the inputs TDI1 to TDIn and END of the device under test may be changed without violating any setup-times or hold times of the inputs (e.g. of the input flip-flops) of device under test, such that the data provided by the tester are taken over into the scan chain with high reliability (small bit error probability, for example, $10^{-6}$ or even smaller). That time window (as described, for example, by temporal regions 630 to 637) is not only dependent on the scan shift period but also on the path delays (120 in FIG. 1), the clock path delay (110 in FIG. 1), and the setup/hold times of the (respective) first scan flip-flop in the scan chain (100 in FIG. 1). In case data changes provided by the ATE would lie outside of the "light grey area" (for a given shift frequency), test results would not be reliable and scan shift frequency would have to be reduced (because data would not be reliably taken over into the one or more scan chains of the device under test because the timing requirements, for example, setup and/or hold times, are violated). Also, the closer the crossing points (e.g times at which the data values output by the tester are changed) get to the "dark grey area", margins would be reduced and device yield would be decreasing in manufacturing (since the take-over of data into the scan chain of the device under test would be somewhat unreliable, wherein an incorrect take-over of data into the scan chain of the device under test would normally result in incorrect output data of the scan chain, which, in turn, would result in a classification of the device under test as being faulty).

Optimization (as presented in the invention) for TDIs adjusts the timing verniers of the ATE (510 in FIG. 5) to make sure data changes (of data values output to the device under test) occur in the middle of the "safe operating" area taking into account all path delays and scan flip-flop set-up/hold times. Therefore scan frequency can be maximized without violating the margins.

Such an optimization may, for example be performed by outputting a sequence of data into the scan chain using a number of different delay values of the output delay line of the tester (or, more general, using a plurality of different tester output timings at the one or more tester outputs for signals TDI1 to TDIn, and possibly any other scan chain inputs like JTAG, TDC, and so on) and by capturing (or analyzing) the output sequences of the scan chain for a plurality of different tester output timings (at the one or more tester outputs for signals TDI1 to TDIn, and possibly any other scan chain inputs like JTAG, TDC, and so on). Accordingly, a range of timing settings of said tester output timings can be identified for which the error rate of the (captured or analyzed)) output sequences of the scan chain is reasonably low (e.g., below a predetermined threshold, which may be close to zero). In a very simple example, the output sequences of the scan chain are delayed copies of the input sequence of the scan chain if the timing requirements (setup- and hold times, and the like) of the inputs of the scan chain are not violated, while differences between the input sequences of the scan chain and the output sequences of the scan chain occur if the timing requirements of the (one or more) inputs of the scan chain are violated. Thus, a comparison between the input sequence of the scan chain and the output sequence of the scan chain (which considers the total delay of the scan chain) can be used to determine "error rate", and to thereby identify settings of the tester output timings which obey or violate the timing requirements of the inputs of the scan chain. However, it is naturally possible that the expected (correct) output sequence of the scan chain (for a given input sequence) differs from the given input sequence. In this case, a comparison between the actual output sequence of the scan chain and the expected (correct) output sequence of the scan chain can be used to conclude whether the input sequence has been reliably accepted by the one or more input of the scan chain (since it is expected that an incorrectly taken-over input sequence of the scan chain results in an incorrect output sequence of the scan chain). Accordingly, when a range of timing settings of the output timings of the tester has been identified for which reliable (correct) output values of the scan chain are obtained, the tester may select a timing setting of the output timing within said identified range of timing settings as a "safe" timing setting of the output timing. For example the tester may select a timing setting of the output timing which lies at the center, or at least approximately at the center (for example, within a tolerance of +/−20%, or +/−1 or 2 timing adjustment steps) of said identified range of timing settings (for which the scan chain provides "correct" or "expected" output sequences) as a "safe" timing setting of the output timing. Accordingly, it is possible to identify a timing setting of the output timing which allows for a particularly high reliability, and which consequently also allows for a particularly high bit rate (short scan shift period) and for a particularly short test time.

In other words, scan shift periods 600-607 are associated with input pins TDI1-TDIn and ENB (the Scan Enable signal which controls the Mode). Timing regions 610-617 and 620-627 are unstable regions of the data edges (which means that the input circuitry of the device under test will not reliably take over a data value provided by the tester if a transition of the data value provided by the tester occurs during one of the unstable regions 610 to 617 and 620 to 627), and timing regions 630-637 are the stable regions (also termed "pass windows") (wherein the device under test will typically take over a data value provided by the tester with high reliability if a transition of the data value provided by the tester occurs during one of the stable regions). Note that, if a data edge (of a sequence of data values represented by an one or more output signals provided by the tester) falls within an unstable region, the test result would, with a high probability, be "fail", whereas if the data edges (of a sequence of data values represented by one or more output signals provided by the tester) fall within a stable region, the test result would (typically, for a fault-free device, and assuming that the other timing parameters are also set within an acceptable range) be "pass". If no timing skew adjustments (of the one or more output signals of the tester provided to the TDI inputs of the device under test) are made (which is shown in the left half of FIG. 6), input data edge points 640-647 occur at the same time, which for some pins is very near the unstable regions (shown in dark grey), and allows only a very small acceptable window (or no acceptable window if timing skews were slightly greater than those shown in this example). In other words, if the transitions (edges) of the output signals provided by the tester were temporally arranged at the same time for all output signals (e.g., TDI1 to TDIn and ENB), only a very small temporal range would exist during which the edges could be placed such that the edges of all output signals are within the stable regions 630-637 (within which no violation of timing requirements occurs) of the respective inputs of the device under test. If timing skew adjustments are made, as according to the instant inventive method and apparatus, TDI input data edge points 650-657 (i.e. times at which the tester output signals applied to the TDI inputs of the device under test have transitions) are substantially center aligned in the middle of pass windows 630-637 for given clock pin timings and frequency. The acceptable window (i.e., the range over which the timings of the output signals provided by the tester may be varied, relative to the optimized setting shown in the right half of FIG. 6, by intentional or parasitic timing modifications without violating the input timing requirements of the device under test) is thereby increased, and yield (in terms of device under test for which a positive test result is obtained) is improved.

Figure 7:
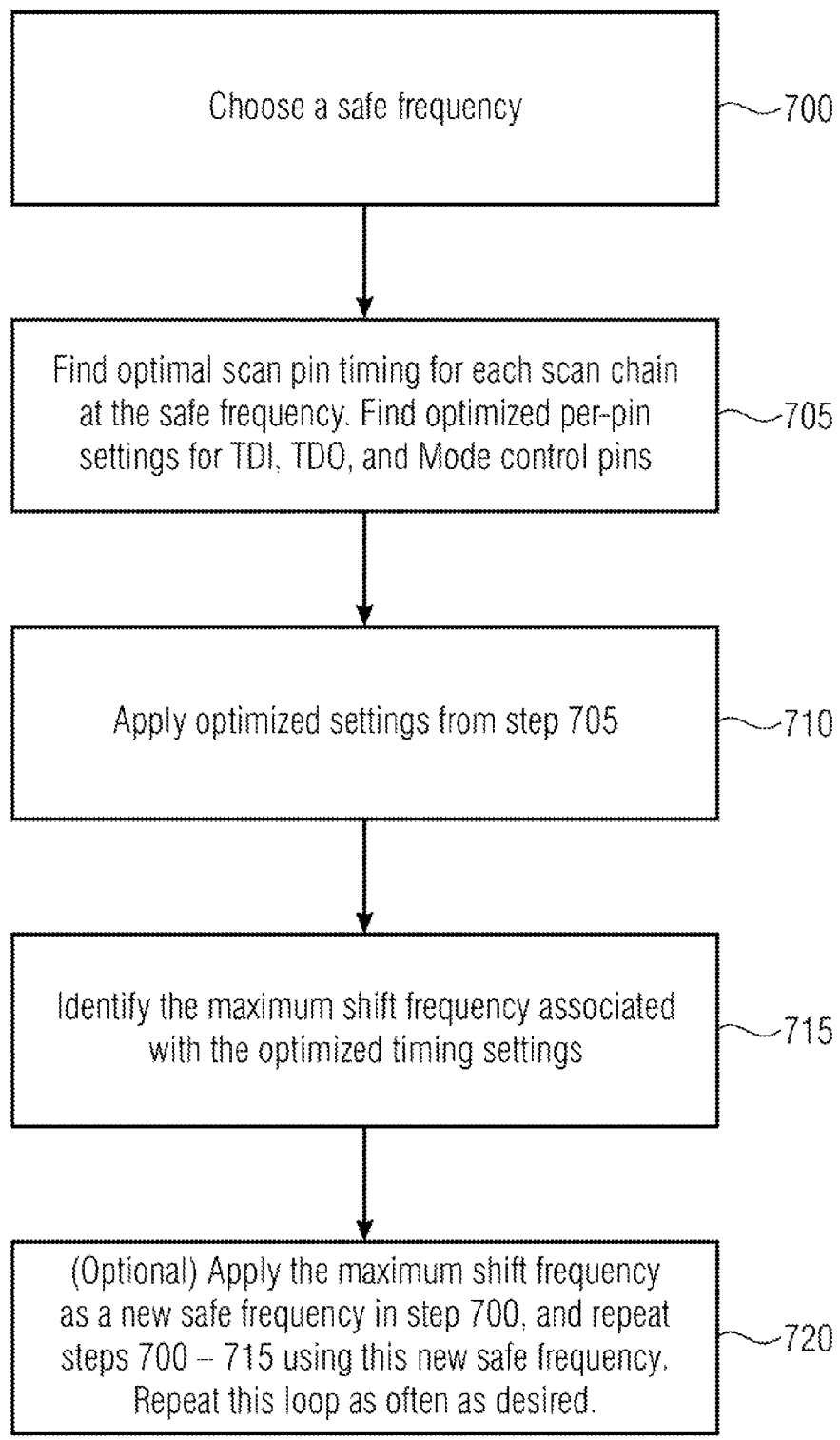
FIG. 7 illustrates a flow diagram for an exemplary algorithm which may be used to optimize the timing skews and frequency for multiple scan chains in parallel.

FIG. 7 illustrates a flow diagram for an exemplary algorithm which may be used to optimize the timing skews and frequency for multiple scan chains in parallel. Note that this is only one example of an optimization algorithm, and is not limiting.

In step 700, choose a "safe" frequency, i.e. a low enough frequency to ensure a valid scan output for all scan chains, as the starting frequency.

In step 705, find optimal scan pin timing for each scan chain at the "safe" frequency. This may be accomplished with a feedback loop correlating scan pin timing with number of failures observed (which may involve statistical modeling over all pins), and finding the timing corresponding to the minimum number of failures. If the number of failures for the best timing is not acceptably low, the safe frequency is lowered. Optimized per-pin settings would be found for the TDI, TDO, and Mode control pins.

In step 710, apply the optimized settings from step 705.

In step 715, identify the maximum shift frequency associated with the optimized timing settings. This may be accomplished by using an equation based max frequency search. Optionally, the maximum shift frequency may be constrained to meet DUT power and/or thermal conditions. This may be achieved by using Idd sampling to monitor Idd during shift operations, specifically monitoring max Idd across all shift cycles.

In step 720 (optional), apply the maximum shift frequency as a new safe frequency in step 700, and repeat steps 700-715 using this new safe frequency. This loop may be repeated as often as desired.

System Considerations

Figure 8:
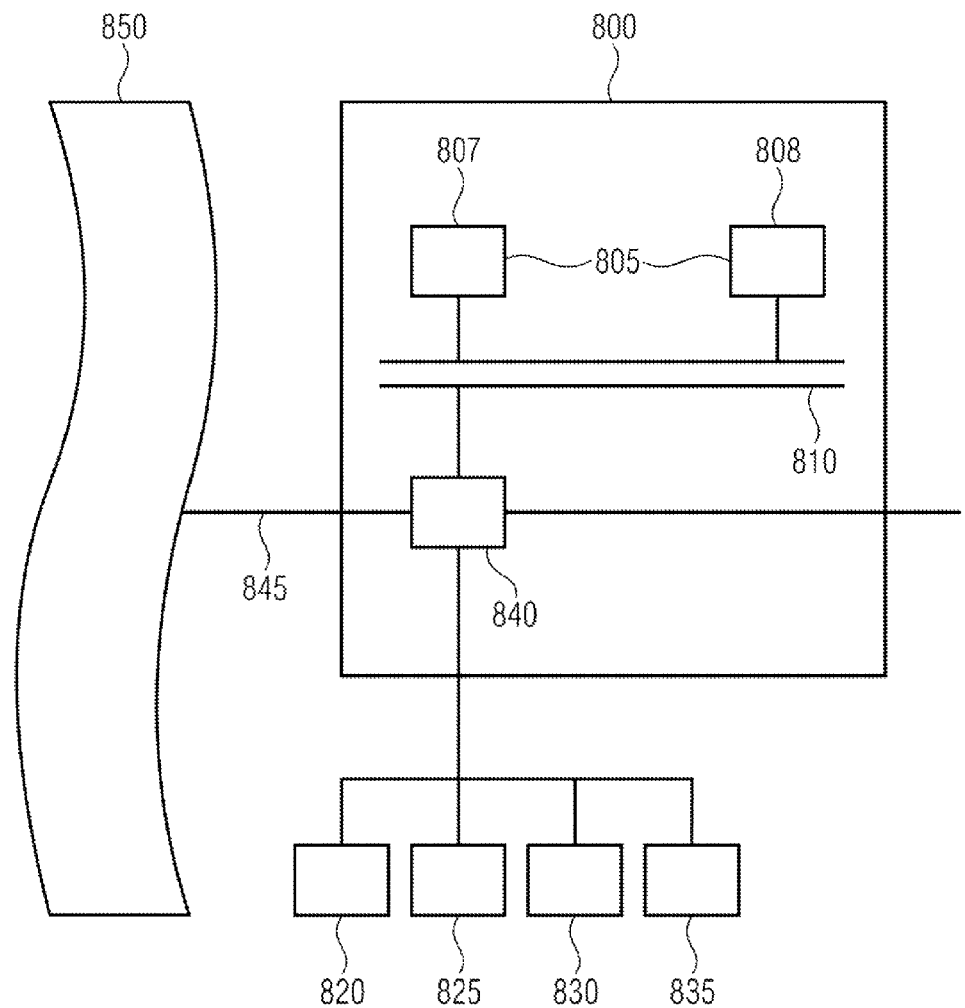
FIG. 8 illustrates an exemplary computer system which may be used to implement portions of the invention.

The inventive methods or portions thereof may be computer-implemented. The computer system, illustrated in FIG. 8, may include a processor 800 (e.g. a processor core, a microprocessor, a computing device, etc), memory 805 which may include a main memory 807 and a static memory 808, which communicate with each other via a bus 810. The machine may further include a display unit that may comprise a touch-screen, or a liquid crystal display (LCD), or a light emitting diode (LED) display, or a cathode ray tube (CRT). As shown, the computer system also may include a human input/output (I/O) device 820 (e.g. a keyboard, an alphanumeric keypad, etc), a pointing device 825 (e.g. a mouse, a touch screen, etc), a drive unit 830 (e.g. a disk drive unit, a CD/DVD drive, a tangible computer readable removable media drive, an SSD storage device, etc), a signal generation device 835 (e.g. a speaker, an audio output, etc), and a network interface device 840 (e.g. an Ethernet interface, a wired network interface, a wireless network interface, a propagated signal interface, etc).

The drive unit 830 may include a machine-readable medium on which is stored a set of instructions (i.e. software, firmware, middleware, etc) embodying any one, or all, of the methodologies described above. The set of instructions is also shown to reside, completely or at least partially, within the main memory 807 and/or within the processor 800. The set of instructions may further be transmitted or received via the network interface device 840 over the network bus 845 to network 850.

It is to be understood that embodiments of this invention may be used as, or to support, a set of instructions executed upon some form of processing core (such as the CPU of a computer) or otherwise implemented or realized upon or within a machine- or computer-readable medium. A machine-readable medium includes any mechanism for storing or transmitting information in a form readable by a machine (e.g. a computer). For example, a machine-readable medium includes read-only memory (ROM); random access memory (RAM); magnetic disk storage media; optical storage media; flash memory devices; electrical, optical, acoustical or other form of propagated signals (e.g. carrier waves, infrared signals, digital signals, etc); or any other type of media suitable for storing or transmitting information.

It is not expected that the present invention be limited to the exact embodiments disclosed herein. Those skilled in the art will recognize that changes or modifications may be made without departing from the inventive concept. By way of example, controlling Trise and Tfall of the shift clock independently could be used for further optimization, e.g., for dual-slope HT-Scan. By further way of example, the input and output paths may be decoupled from the actual scan chains, which may help to accelerate the algorithm and ease its implementation.

The scope of the invention should be construed in view of the claims.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A scan optimizer system comprising:
   multiple parallel scan chains, wherein said scan chains comprise an input path and an output path; and
   control logic coupled to said scan chains and comprising a modifier for modifying timing of said input path and said output path;
   wherein said control logic is configured to increase a scan frequency by modifying timing offsets of each individual scan chain of said scan chains to affect timing skew between said scan chains to control TDO strobe edges to occur in passing ranges for all of said scan chains.

2. The scan optimizer system of claim 1, wherein said modifier provides a time delay to at least one of said input path and said output path.

3. The scan optimizer system of claim 2, wherein said modifier comprises at least one timing vernier in at least one of said input path and said output path.

4. The scan optimizer system of claim 3 comprising timing verniers in said input path configured to control TDI input data edges in each of said scan chains during shift in to position said TDI input data edges near the center of a respective passing range of each of said scan chains.

5. The scan optimizer system of claim 3 comprising timing verniers in said output path configured to control and adjust said TDO strobe edges in each of said scan chains during shift out to position said TDO strobe edges near the center of a respective passing range of each of said scan chains.

6. The scan optimizer system of claim 1 wherein said output path comprises:
   an automatic test equipment (ATE) receiver;
   a sampling flip-flop coupled to said ATE receiver and controlled by an input from said TDO strobe;
   a test processor that receives an output from said sampling flip-flop, wherein said test processor makes a pass/fail decision regarding data sampled by said sampling flip-flop;
   a multiplexer that receives said pass/fail decision from said test processor as input, wherein an output from said multiplexer forms a feedback loop comprising a timing vernier that is adjustable to modify timing of said TDO strobe.

7. A computer-implemented method of maximizing scan throughput of multiple parallel scan chains, said method comprising:
   controlling TDI input data edges in each of said scan chains during shift in to position said TDI input data edges near the center of a passing range of each of said scan chains;
   controlling and adjusting TDO strobe edges during shift out to position said TDO strobe edges near the center of a respective passing range of each of said scan chains; and
   increasing a scan frequency by modifying timing offsets of each of said scan chains to affect timing skew between said parallel scan chains to enable said TDO strobe edges for all of said scan chains to occur within said respective passing range.

8. The method of claim 7 wherein said controlling TDI input data edges in each of said scan chains during shift in comprises receiving a test pattern output from a pattern generator into a timing vernier that adjusts timing of said test pattern into an input pad that controls said shift in data.

9. The method of claim 7 wherein said controlling and adjusting TDO strobe edges during shift out comprises:
   controlling a sampling flip-flop by an input from said TDO strobe;
   making a pass/fail decision regarding data sampled by said sampling flip-flop;
   receiving said pass/fail decision at a multiplexer; and
   adjusting a timing vernier to modify timing of said TDO strobe according to an output from said multiplexer.

10. A computer-implemented method of maximizing scan throughput of multiple parallel scan chains, said method comprising:
   a) choosing a safe shift frequency;
   b) determining optimal scan pin timing at said safe frequency, wherein said determining optimal scan pin timing at said safe frequency comprises modifying timing offsets of each of said scan chains to affect timing skew between said scan chains to enable said TDO strobe edges for all of said scan chains to occur within stable regions;
   c) determining and applying per-pin timing settings for TDI, TDO, and Mode control pins; and d) determining a maximum shift frequency associated with said per-pin timing settings.

* * * * *